(12) United States Patent
Wey (10) Patent No.: US 9,966,902 B2
(45) Date of Patent: May 8, 2018

(54) MULTIPLE-BAND MATCHING NETWORK FOR A DOHERTY POWER AMPLIFIER AND AMPLIFIERS, TRANSMITTERS, AND BASE STATIONS USING THE SAME

(71) Applicant: Nokia Solutions and Networks Oy, Espoo (FI)

(72) Inventor: Chia Sam Wey, Colleyville, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days. days.

(21) Appl. No.: 15/279,669

(22) Filed: Sep. 29, 2016

(65) Prior Publication Data

US 2018/0091100 A1    Mar. 29, 2018

(51) Int. Cl.
| | | |
|---|---|---|
| H03F 3/68 | (2006.01) | |
| H03F 1/02 | (2006.01) | |
| H03F 3/21 | (2006.01) | |
| H03F 1/56 | (2006.01) | |
| H04B 1/04 | (2006.01) | |

(52) U.S. Cl.
CPC ............. *H03F 1/0288* (2013.01); *H03F 1/56* (2013.01); *H03F 3/21* (2013.01); *H04B 1/04* (2013.01); *H03F 2200/111* (2013.01); *H03F 2200/423* (2013.01); *H03F 2200/541* (2013.01)

(58) Field of Classification Search
CPC .................................................. H03F 1/0288
USPC ........................................ 330/124 R, 295, 84
See application file for complete search history.

(56) References Cited

U.S. PATENT DOCUMENTS

| | | | |
|---|---|---|---|
| 7,876,159 B2 * | 1/2011 | Wang | H03F 1/0288 330/124 R |
| 8,502,599 B2 | 8/2013 | Conradi | |
| 2008/0129410 A1 * | 6/2008 | Fukuda | H03F 1/0288 333/129 |

OTHER PUBLICATIONS

S. Ji et al., "Concurrent Dual-Band Class-E Power Amplifier Using Composite Right/Left-Handed Transmission Lines", IEEE Transactions on Microwave Theory and Techniques, vol. 55, No. 6, pp. 1341-1347, Jun. 2007.

(Continued)

*Primary Examiner* — Khanh V Nguyen
*Assistant Examiner* — Khiem Nguyen
(74) *Attorney, Agent, or Firm* — Harrington & Smith (57) ABSTRACT

An apparatus includes a Doherty PA having an input, an output manifold, and peaking and main amplifier paths. The peaking amplifier path includes peaking amplifier(s) configured to amplify signals over multiple frequency bands. A main amplifier path is separate from the peaking amplifier path until the main amplifier path terminates in the output manifold. The main amplifier path includes main amplifier(s), configured to amplify signals over the multiple frequency bands, and a multiple-band matching network coupled to the output of the main amplifier(s) and terminating in the output manifold. The multiple-band matching network includes multiple signal paths, one for each of the multiple frequency bands. Each signal path includes circuitry configured to pass signals to the output manifold from only a unique one of the multiple frequency bands and to reject signals from others of the multiple frequency bands. The circuitry for each signal path includes a resonant tank.

19 Claims, 9 Drawing Sheets

(56) References Cited

OTHER PUBLICATIONS

R. Negra et al., "Concurrent Dual-Band Class-F Load Coupling Network for Applications at 1.7 and 2.14 GHz", IEEE Transactions on Circuits and Systems—II: Express Briefs, vol. 55, No. 3, pp. 359-263, Mar. 2008.
P. Colantonio et al., "A Design Technique for Concurrent Dual-Band Harmonic Tuned Power Amplifier", IEEE Transactions on Microwave Theory and Techniques, vol. 56, No. 11, pp. 2545-2555, Nov. 2008.
D. Runton et al., "Doherty Power Amplifier Design", Presentation, Downloaded on Aug. 31, 2016 from http://www.rfmd.com/sites/default/files/resources/migration/presentations/Com-mDRuntonPASymposium11.pdf.

* cited by examiner

MULTIPLE-BAND MATCHING NETWORK FOR A DOHERTY POWER AMPLIFIER AND AMPLIFIERS, TRANSMITTERS, AND BASE STATIONS USING THE SAME

TECHNICAL FIELD

This invention relates generally to wireless communications and, more specifically, relates to amplification of RF signals for wireless communications.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below, after the main part of the detailed description section.

Having a base station TRX (transmitter and receiver) operate simultaneously at two different bands has gained attention in recent base station TRX design. The capability of the TRX to operate in dual bands can provide great cost savings for operators of wireless systems such as cellular systems by reducing the number of TRXs in co-sited situations. Such co-sited situations are where the operators are trying to fit multiple base stations in a relatively small area, such as being sited at the same location. However, dual-band amplifiers are difficult to design because matching networks are usually made to operate at one specific frequency.

BRIEF SUMMARY

This section is intended to include examples and is not intended to be limiting.

An apparatus is disclosed that comprises a Doherty power amplifier. The Doherty power amplifier has an input and has an output manifold configured to be coupled to a load. The Doherty power amplifier comprises:

a peaking amplifier path between and coupled to the input of the Doherty power amplifier and the output manifold and terminating in the output manifold, the peaking amplifier path comprising at least one peaking amplifier configured to amplify signals over multiple frequency bands;

a main amplifier path between and coupled to the input of the Doherty power amplifier and the output manifold and terminating in the output manifold, the main amplifier path separate from the peaking amplifier path until the main amplifier path terminates in the output manifold, the main amplifier path comprising:

at least one main amplifier coupled to the input of the Doherty power amplifier and having an output, the at least one main amplifier configured to amplify signals over the multiple frequency bands; and a multiple-band matching network coupled to the output of the at least one main amplifier and terminating in the output manifold, the multiple-band matching network comprising a plurality of signal paths, one path for each of the multiple frequency bands, where each signal path for the multiple frequency bands terminates in the output manifold and comprises circuitry coupled to the output of the at least one main amplifier, the circuitry for each signal path configured to pass signals to the output manifold from only a unique one of the multiple frequency bands and to reject signals from others of the multiple frequency bands, the circuitry for each signal path comprising a resonant tank.

BRIEF DESCRIPTION OF THE DRAWINGS

In the attached Drawing Figures:

FIG. 4 includes both FIGS. 4A and 4B, and illustrates Hi Q resonant tank examples, where

FIG. 6, which is split into FIG. 7, which is split into

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments herein describe techniques and apparatus for dual-band matching network for a Doherty power amplifier and amplifiers and base stations using the same. Additional description of these techniques is presented after a system into which the exemplary embodiments may be used is described.

Figure 1:
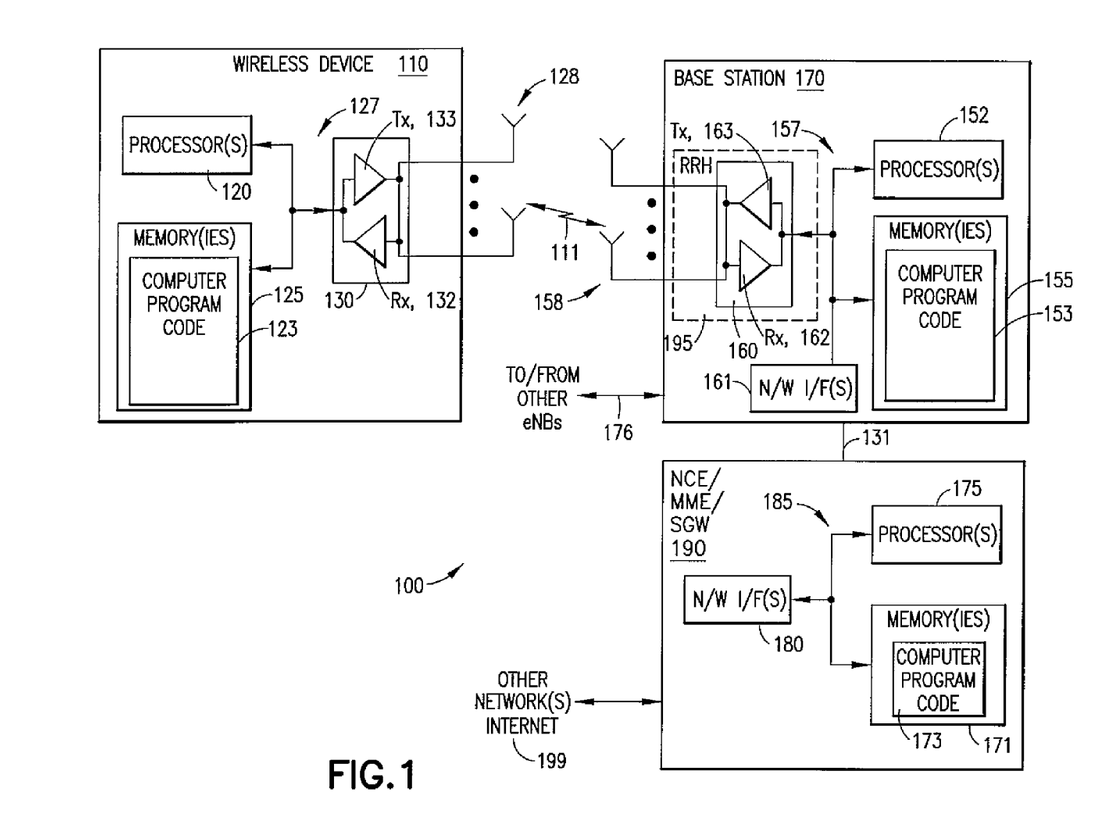
FIG. 1 is a block diagram of one possible and non-limiting exemplary system in which the exemplary embodiments may be practiced.

Turning to FIG. 1, this figure shows a block diagram of one possible and non-limiting exemplary system in which the exemplary embodiments may be practiced. In FIG. 1, a wireless device (such as a user equipment, UE) 110 is in wireless communication with a wireless network 100 via a base station 170. In an example, the wireless network 100 is a cellular network and the NCE/MME/SGW 190 shown is an illustration of part of a core network for the cellular network, and where the base station is typically called an eNB. However, the instant embodiments are not limited to such a network and may be implemented in other networks, such as WI-FI (a trademark of the Wi-Fi Alliance, and a technology that allows electronic devices to connect to a wireless LAN (WLAN)), where the base station is typically called an access point. The invention is also applicable to other networks that use multiple frequencies for transmission. In particular, note that the instant embodiments can apply to any amplifier circuit that needs dual band design where wide band amplifier design is not possible or is not used. As such, the instant embodiments could also be implemented by other transmitters, such as transmitter(s) in the wireless device 110. However, for ease of exposition, the instant embodiments are assumed to be implemented in the transmitter(s) in the base station 170.

The wireless device 110 is a wireless, typically mobile device that can access a wireless network. The wireless device 110 includes one or more processors 120, one or more memories 125, and one or more transceivers 130 interconnected through one or more buses 127. Each of the one or more transceivers (or TXR) 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. For instance, the one or more memories 125 and the computer program code 123 may be configured to, with the one or more processors 120, cause the user equipment 110 to perform operations such as transmission of data using the transmitter(s) 133. The wireless device 110 communicates with the base station 170 via a wireless link 111.

The base station (e.g., an eNB, evolved NodeB, for LTE, long term evolution, cellular system) 170 provides access by wireless devices 110 (e.g., as UEs) to the wireless network 100. The base station 170 includes one or more processors 152, one or more memories 155, one or more network interfaces (N/W I/F(s)) 161, and one or more transceivers 160 interconnected through one or more buses 157. Each of the one or more transceivers (or TXR) 160 includes a receiver, Rx, 162 and a transmitter, Tx, 163. The instant embodiments involve improvements to amplifiers in the transmitter(s) 163. The one or more transceivers 160 are connected to one or more antennas 158. The one or more memories 155 include computer program code 153. For instance, the one or more memories 155 and the computer program code 153 are configured to, with the one or more processors 152, cause the base station 170 to perform operations such as transmitting using the transmitter(s) 163. The one or more network interfaces 161 communicate over a network such as via the links 176 and 131. Two or more base stations 170 communicate using, e.g., link 176. The link 176 may be wired or wireless or both and may implement, e.g., an X2 interface.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195, with the other elements of the base station 170 being physically in a different location from the RRH, and the one or more buses 157 could be implemented in part as fiber optic cable to connect the other elements of the base station 170 to the RRH 195.

The wireless network 100 (e.g., in a cellular embodiment) may include a network control element (NCE) 190 that may include MME (Mobility Management Entity)/SGW (Serving Gateway) functionality, and which provides connectivity with a further network, such as a telephone network and/or a data communications network (e.g., the Internet) illustrated as the other network(s)/Internet 199. The base station 170 is coupled via a link 131 to the NCE 190. The link 131 may be implemented as, e.g., an S1 interface. The NCE 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the NCE 190 to perform one or more operations.

In other embodiments, such as a WI-FI embodiment, the NCE 190 or another entity may not be used and there could be another connection to the other network(s)/Internet 199 without the NCE 190 or other entity (or another entity 190 could be used to help with or provide the connection to the other network(s)/Internet 199). Other configurations are also possible.

The wireless network 100 may implement network virtualization, which is the process of combining hardware and software network resources and network functionality into a single, software-based administrative entity, a virtual network. Network virtualization involves platform virtualization, often combined with resource virtualization. Network virtualization is categorized as either external, combining many networks, or parts of networks, into a virtual unit, or internal, providing network-like functionality to software containers on a single system. Note that the virtualized entities that result from the network virtualization are still implemented, at some level, using hardware such as processors 152 or 175 and memories 155 and 171, and also such virtualized entities create technical effects.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The computer readable memories 125, 155, and 171 may be means for performing storage functions. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples. The processors 120, 152, and 175 may be means for performing functions, such as controlling the wireless device 110, base station 170, and other functions as described herein.

Having thus introduced one suitable but non-limiting technical context for the practice of the exemplary embodiments of this invention, the exemplary embodiments will now be described with greater specificity.

Figure 2:
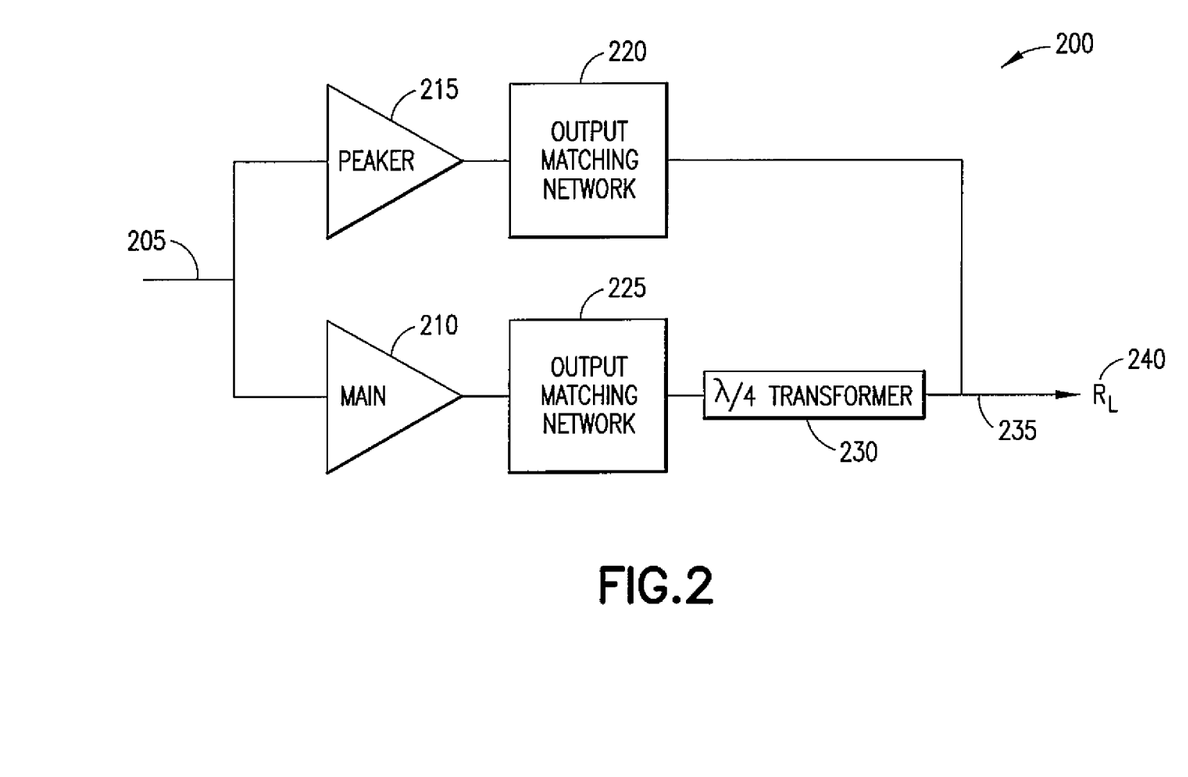
FIG. 2 illustrates a conventional Doherty power amplifier.

Turning to FIG. 2, this figure illustrates a conventional Doherty power amplifier 200. The conventional Doherty power amplifier 200 comprises a main amplifier 210 and a peaking ("peaker") amplifier 215, which operate to amplify signals on the input 205. The main amplifier 210 operates most of the time, and the peaking amplifier 215 operates only when peak power is needed. There are two output matching networks 220 and 225, for the peaking amplifier 215 and the main amplifier 225, respectively. In addition to the output matching networks 225, a $\lambda/4$ wave impedance transformer 230 is essential for the conventional Doherty power amplifier 200 to perform the famous load modulation that modulates the load for the main amplifier 210 to achieve a high efficiency at a high back off condition for a high PAR signal. The output 235 feeds the amplified signal to the resistive load $R_L$ 240. This $\lambda/4$ wave impedance transformer 230 can also be integrated inside the power amplifier chip or absorbed by the output matching network 225 to form the so-called "Inverted Doherty". Unfortunately, the load modulation itself and the quarter wave impedance transformer 230 are very narrow band in nature, therefore they are the most limiting factors in designing a wideband Doherty power amplifier.

Since the load modulation has made the Doherty power amplifier 200 only useful in narrow-band applications, Doherty power amplifiers are usually made to operate at one specific frequency band in order to deliver the optimum performance. However, degraded performance will be expected if the Doherty power amplifier is used to cover the entire bandwidth.

The exemplary embodiments herein propose an output matching structure that allows two (or more) different output matching networks for a power amplifier device. The exemplary embodiments herein are perfectly suited for dual-band (or higher multi-band) operation without degradation of performance, since each band has its own output matching network and co-existence at the output of the power amplifier device.

Thus, the exemplary embodiments provide a novel solution in designing the inherent narrow band Doherty amplifier to operate in dual-band (or higher multi-band) conditions.

Figure 3:
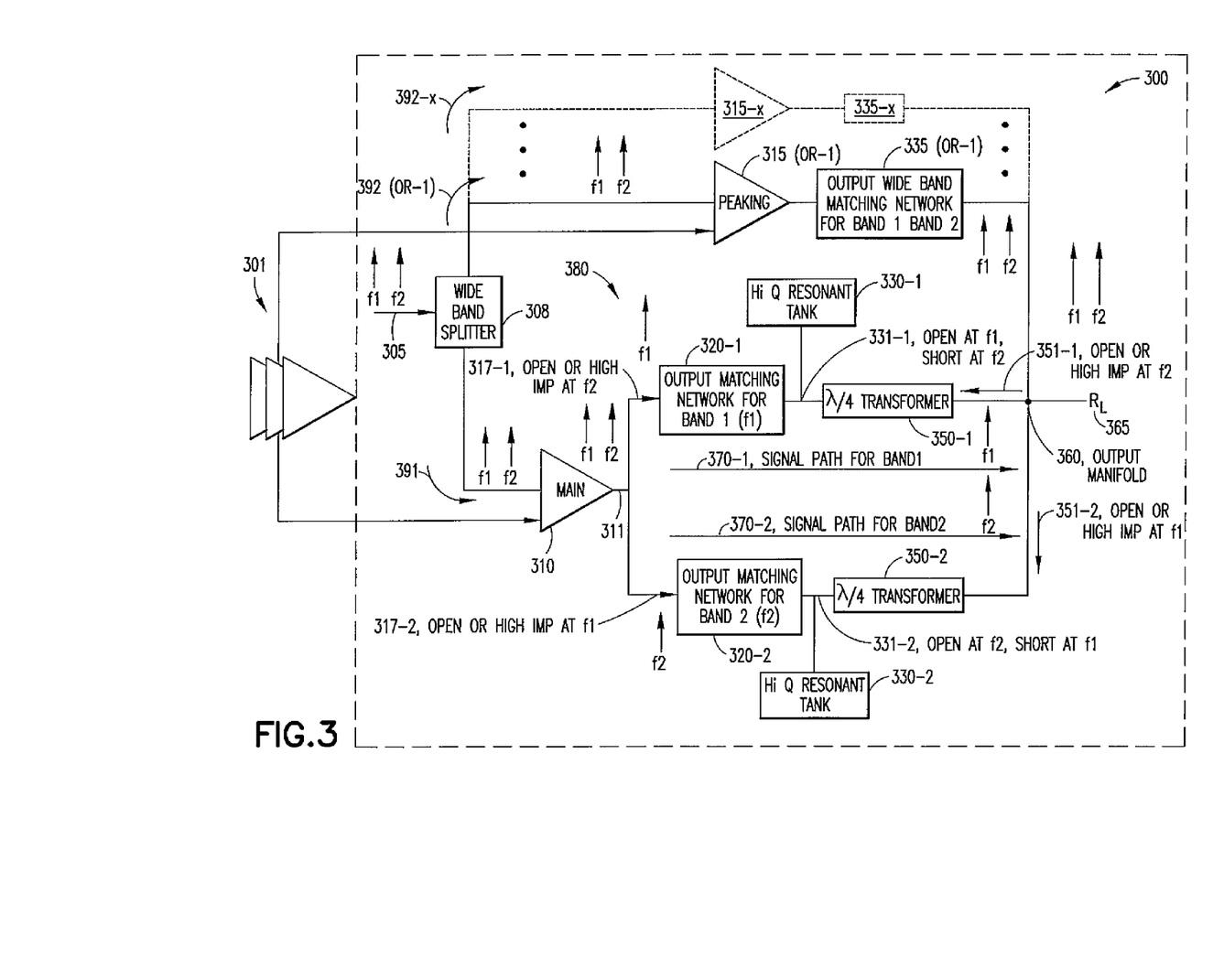
FIG. 3 illustrates a Doherty power amplifier comprising a dual-band matching network, as part of a transmitter and in accordance with an exemplary embodiment.

Referring to FIG. 3 this figure illustrates a Doherty power amplifier 300 comprising a dual-band matching network 380, as part of a transmitter 163, in accordance with an exemplary embodiment. The Doherty power amplifier 300 comprises a wide band splitter 308 accepting from the input 305 signals for two bands, illustrated as f1 (e.g., frequency band 1) and f2 (e.g., frequency band 2), and splitting the signals into a main amplifier path 391 and a peaking amplifier path 392. Note that both bands can be transmitted at the same time because Hi-Q resonators provide isolation between the two paths, as described below. Additionally, although examples with two bands are described herein, tri-band (or an even higher number of bands) theoretically can also be implemented, e.g., if the bands have about 10% (ten percent) bandwidth separation between them, but these types of implementations might be more complicated and take up more physical space than a dual-band implementation.

The Doherty power amplifier 300 further comprises a main amplifier 310, a peaking amplifier 315, an output wide band matching network 335 for band 1 and band 2, a dual-band matching network 380, and an output manifold 360 that is connected to a resistive load R$_L$ 365. The main amplifier path 391 comprises the main amplifier 310 and the dual-band matching network 380 and joins the peaking amplifier path 392 at the output manifold 360. The peaking amplifier path comprises the peaking amplifier 315 and the output wide band matching network 335 for band 1 and band 2. The peaking amplifier 315 is a wide band design that covers bands 1 and 2. Unlike one main amplifier output matching network (described below), where it is not engineered to cover both (or multiple) bands, the peaking amp matching network can be wide band and is designed to cover both (or multiple) bands. That is, the output wide band matching network 335 for band 1 and band 2 passes those bands (e.g., passes a frequency range from band 1 to and including band 2) but rejects bands outside those bands and that delivers an optimum peaking amplifier performance for the entire operating bandwidth.

The dual-band matching network 380 comprises a signal path 370-1 for band 1, comprising an output matching network for band 1 (f1) 320-1, a high Q resonant tank 330-1, and a λ/4 transformer 350-1. The dual-band matching network 380 also comprises another signal path 370-2 for band 2, comprising an output matching network for band 2 (f2) 320-2, a high Q resonant tank 330-2, and a λ/4 transformer 350-2.

In more detail, the output (drain) 311 of the main amplifier 310 is split into two paths 370-1, 370-2, where each path 370 has its own matching network 320 and impedance transformer 350 for its specific frequency band before being joined together at the output manifold 360. The isolation between two bands is performed by placing a high Q (Hi-Q) resonant tank 330 between the output matching network 320 and the impedance transformer 350 as shown in each path 370.

As indicated by reference 317-1, there is an open or high impedance at f2 looking into the output matching network for band 1 (f1) 320-1. Similarly, as indicated by reference 317-2, there is an open or high impedance at f1 looking into the output matching network for band 2 (f2) 320-2.

The output λ/4 wave impedance transformers 350 have the nature to convert short to open or open to short, therefore the output isolation between the two paths 370-1 and 370-2 at the output manifold 360 is also accomplished. Reference 351-1 indicates that there is an open or high impedance at f2 looking into the λ/4 wave impedance transformer 350-1. Reference 351-2 indicates that there is an open or high impedance at f1 looking into the λ/4 wave impedance transformer 350-2.

Each Hi-Q resonant tank 330 provides a short (or very low impedance) at the opposite band and open (or very high impedance) to its own band. This is indicated by the reference 331-1, which indicates there is an open at f1 and short at f2 at the output of the Hi Q resonant tank 330-1. Reference 331-2 similarly indicates there is an open at f1 and short at f2 at the output of the Hi Q resonant tank 330-2.

FIG. 3 also illustrates by reference 301 that one or both of the peaking amplifier 315 and the main amplifier 310 may comprise multiple amplifiers in series. For instance, two stages might be used, a driver amplifier in a first stage and a final amplifier in in a second stage for one or both of the main and peaking amplifiers. Furthermore, the Doherty power amplifier 300 can be a 2-way Doherty (one main amp+one peaking amp), 3-way Doherty (one main amp+2 peaking amps), or even 4-way Doherty (one main amp+3 peaking amps). This ability to add multiple peaking amplifiers 315 is illustrated by the dashed lines and "x" multiple peaking amplifier paths 392-1 through 392-x, such that there would be peaking amplifiers 315-1 through 315-x and output wideband matching networks 335-1 through 335-x. Peaking amplifiers are not frequency selective, and instead they are all operating in the same frequency or frequencies.

Figure 4A:
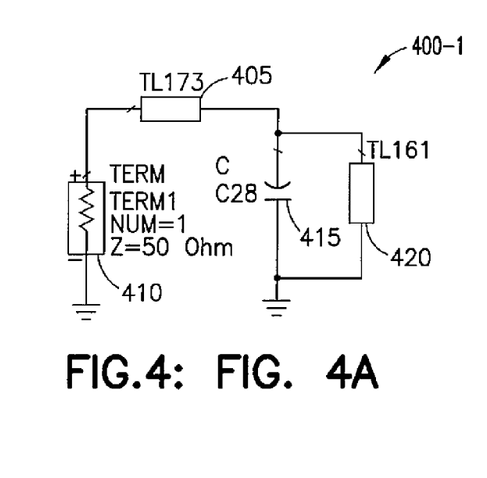
FIG. 4A illustrates a single stage resonant tank example and FIG. 4B illustrates a dual stage resonant tank example.
Figure 4B:
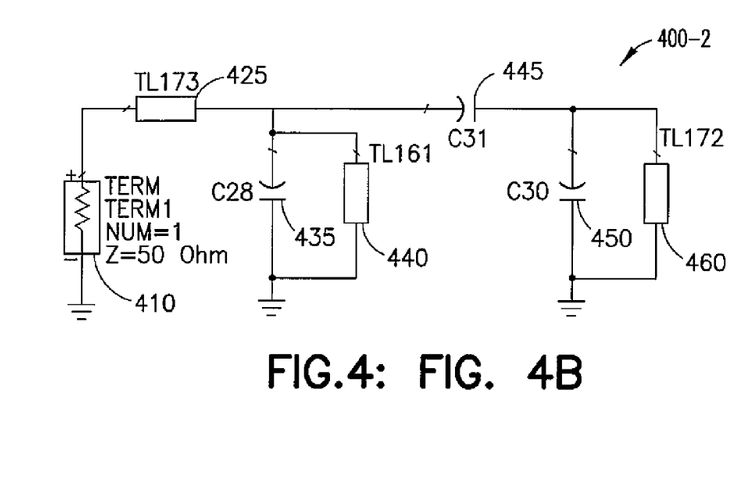

Turning to FIG. 4, this figure includes both FIGS. 4A and 4B, and illustrates Hi Q resonant tank examples. FIG. 4A illustrates a single stage resonant tank example and FIG. 4B illustrates a dual stage resonant tank example. In FIG. 4A, the single stage resonant tank 400-1 comprises a transmission line 405 (labelled as TL173), transmission line 420 (labelled as TL161), and a capacitor (C) 415 (labelled as C28). Also shown on the figure is a 50 ohm port 410 having an impedance (Z) of 50 Ohms. The 50 ohm port 410, marked with a Term for termination, works like a network analyzer to measure the performance only. That is, the 50 ohm port 410 likely would not be used in an actual resonant tank implementation, but is used for simulation purposes.

In FIG. 4B, the dual stage resonant tank 400-2 comprises a first stage comprising transmission line 425 (labelled as TL173) and a transmission line 440 (labelled as TL161) and capacitor 435 (labelled as C28), and a second stage comprising capacitor 445 (labelled as C31), capacitor 450 (labelled as C30) and transmission line 460 (labelled as TL172). Also shown on the figure is a 50 ohm port 410 having an impedance (Z) of 50 Ohms, which is used primarily for simulation purposes.

Figure 5:
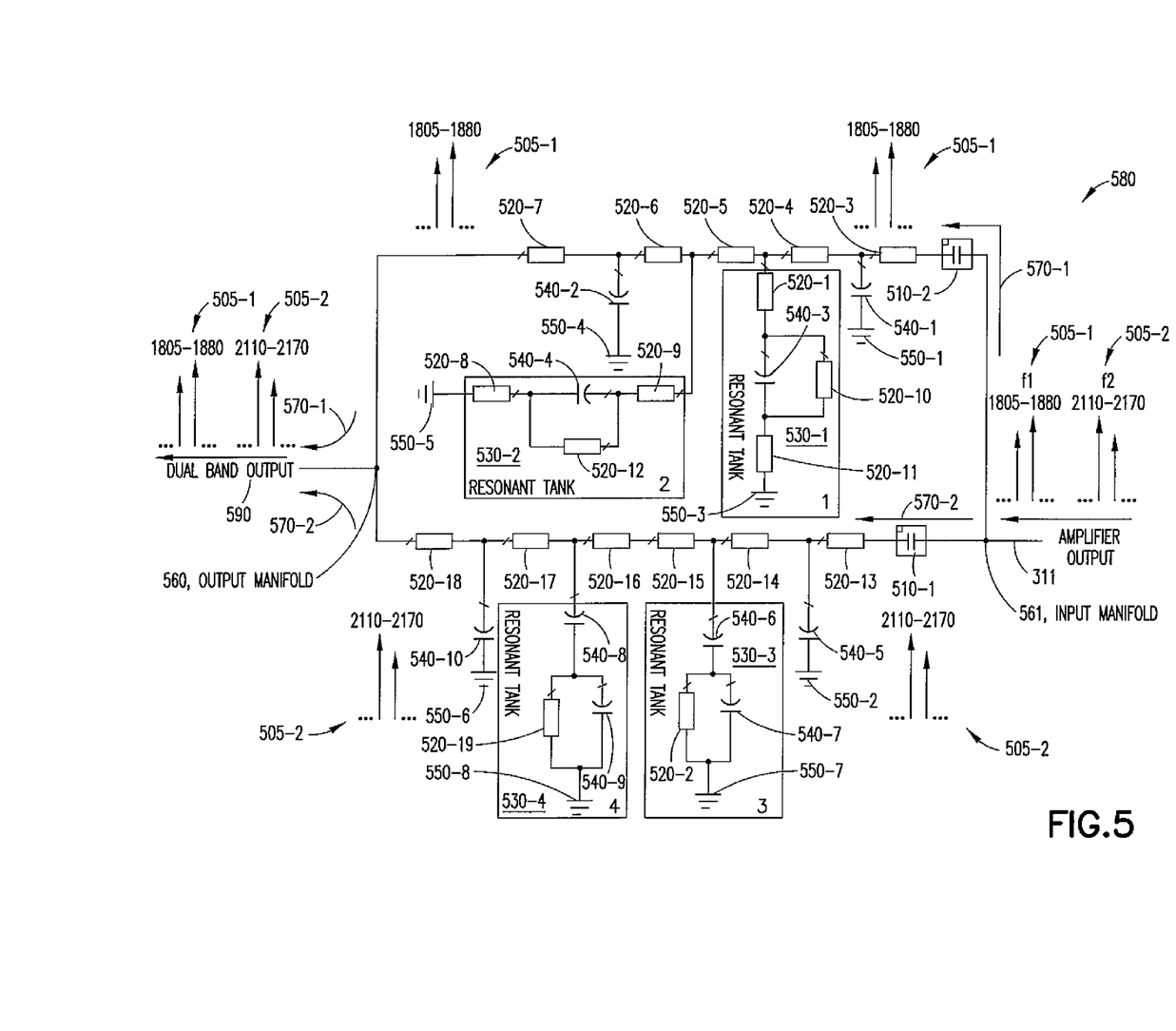
FIG. 5 illustrates an example of a dual-band matching network for a specific example of f1 of 1805 to 1880 MHz and f2 of 2110 to 2170 MHz, in an exemplary embodiment.

Turning to FIG. 5, this figure illustrates an example of a dual-band matching network 580 for a specific example of f1 of 1805 to 1880 MHz and f2 of 2110 to 2170 MHz, in an exemplary embodiment. The dual-band matching network 580 is an example of the dual-band matching network 380 of FIG. 3.

The dual-band matching network 580 comprises two DC blocks 510-1 and 510-2 (e.g., implemented as capacitors), 19 transmission lines 520-1 through 520-19, ten capacitors 540-1 through 540-10, and eight ground connections 550-1 through 550-8. The amplifier output 311 is dual band and is connected to an input manifold 561, and the network 580 produces a dual band output 590 via an output manifold 560. There are four Hi-Q resonant tanks 530-1, 530-2, 530-3, and 530-4.

As shown in FIG. 5, output signals of the amplifier 310 comprise two bands, the f1 1800 MHz band (reference 505-1) and the f2 2100 MHz band (reference 505-2), and each band 505 can have multiple signals and they can be transmitted simultaneously. The 1800 MHz band is shown as being between 1805 and 1880 MHz, and the 2100 MHz band is shown as being between 2110 and 2170 MHz. The output 311 of the amplifier is split into two paths, one path 570-1 for the 1800 MHz (upper path) and one path 570-2 for the 2100 MHz (lower path). The paths 570-1 and 570-2 are similar to the paths 370-1 and 370-2 in FIG. 3. Each path 570 has its own output matching network for its band, the paths 570-1 and 570-2 are split at the input manifold 561, and the outputs of the two paths 570 are combined at the output manifold 560 to form output 590 of the dual band matching network 580. The isolation between two paths 570-1 and 570-2 is provided by the Hi-Q resonant tanks as is explained below.

Concerning Hi-Q resonant tank 1 530-1, this resonant tank in combination with TL 520-4, C 540-1, TL 520-3, and the DC block 510-2 provides open or high impedance to the 2100 MHz band 505-2 and little resistance to the 1800 MHz band 505-1 from the input manifold 561 to the input of the upper path 570-1. TL 520-3, C 540-1, and TL 520-4 can be replaced with a 90 degree transmission line or any network that can rotate the impedance by 90 degrees (open to short/short to open). The Hi-Q resonant tank 1 530-1 comprises the TL 520-1, the C 540-3 and TL 520-10 in a parallel arrangement, the TL 520-11 and the ground connection 550-3.

Concerning Hi-Q resonant tank 3 530-3, this resonant tank in combination with TL 520-14, C 540-5, TL 520-13, and the DC block 510-1 provides open or high impedance to the 1800 MHz band 505-1 and little resistance to the 2100 MHz band 505-2 from the input manifold 561 to the input of the lower path 570-2. TL 520-13, C 540-5, and TL 520-14 can be replaced with a 90 degree transmission line or any network that can rotate the impedance by 90 degrees (open to short or short to open). The Hi-Q resonant tank 3 350-3 comprises C 540-6, C 540-7 and TL 520-2 in a parallel arrangement, and ground connection 550-7.

Resonant tank 1 530-1 and resonant tank 3 530-3 provide the isolation between two bands 505-1 and 505-2 at the input manifold 561 of the dual band matching network 580, therefore the 1800 MHz signals at the output of the amplifier 310 can only flow through the upper path 570-1 and 2100 MHz signals at the output 311 of the amplifier 310 can only flow through the lower path 570-2 of the dual band matching network 580.

Regarding Hi-Q resonant tank 2 530-2, this resonant tank through TL 520-6, C 540-2, and TL 520-7 provides open or high impedance to the 2100 MHz 505-2 and little resistance to the 1800 MHz band 505-1 from the output manifold 560 to the output of the upper path. TL 520-6, C 540-2, and TL 520-7 can be replaced with any network that can rotate the impedance by 90 degrees (open to short or short to open). The Hi-Q resonant tank 2 530-2 comprises a TL 520-9, a C 540-4 and a TL 520-12 in a parallel arrangement, a TL 520-8, and a ground connection 550-5.

Concerning HiQ resonant tank 4 530-4, this resonant tank through TL 520-17, C 540-10, and TL 520-18 provides open or high impedance to the 1800 MHz band 505-1 and little resistance to the 2100 MHz band 505-2 from the output manifold 560 to the output of the lower path. TL 520-17, C 540-10, and TL 520-18 can be replaced with a 90 degree transmission line or any network that can rotate the impedance by 90 degrees (open to short or short to open). The Hi-Q resonant tank 4 530-4 comprises a C 540-8, a C 540-9 and a TL 520-19 in a parallel arrangement, and a ground connection 550-8.

Resonant tank 2 and resonant tank 4 provide the isolation between two bands 505-1 and 505-2 at the output manifold of the dual band structure, therefore the 1800 MHz signals in the upper path 570-1 will only flow out to the output load and will not flow back to the lower path 570-2. The same phenomenon applies to the 2100 MHz band 505-2 (the 2100 MHz signals in the lower path 570-2 will only flow out to the output load and will not flow back to the upper path 570-1).

FIG. 5 is also used to illustrate other concepts. In particular, in FIG. 3, the Hi Q resonant tanks 330 were "between" the output matching networks 320 and the $\lambda/4$ transformers 350. This is, however, one example and not always the way a Doherty power amplifier 300 will be implemented.

For instance, the output matching network(s) 320 can be part of the $\lambda/4$ transformer(s) 350 in certain implementations. Theoretically, TLs 520-7 and 520-18 are $\lambda/4$ transformers 350, but in reality the phase transformation could be shorter or longer than $\lambda/4$. In FIG. 5, other than TLs 520-7 and 520-18, these TLs 520 all belong to an output matching network 320. Since in this case 520-7 and 520-18 are less than $\lambda/4$, so resonant tanks 2 and 4 are placed inside the output matching networks 320. For clarity, a 90 degrees transmission line is the same as a $\lambda/4$ transformer.

Figure 6A:
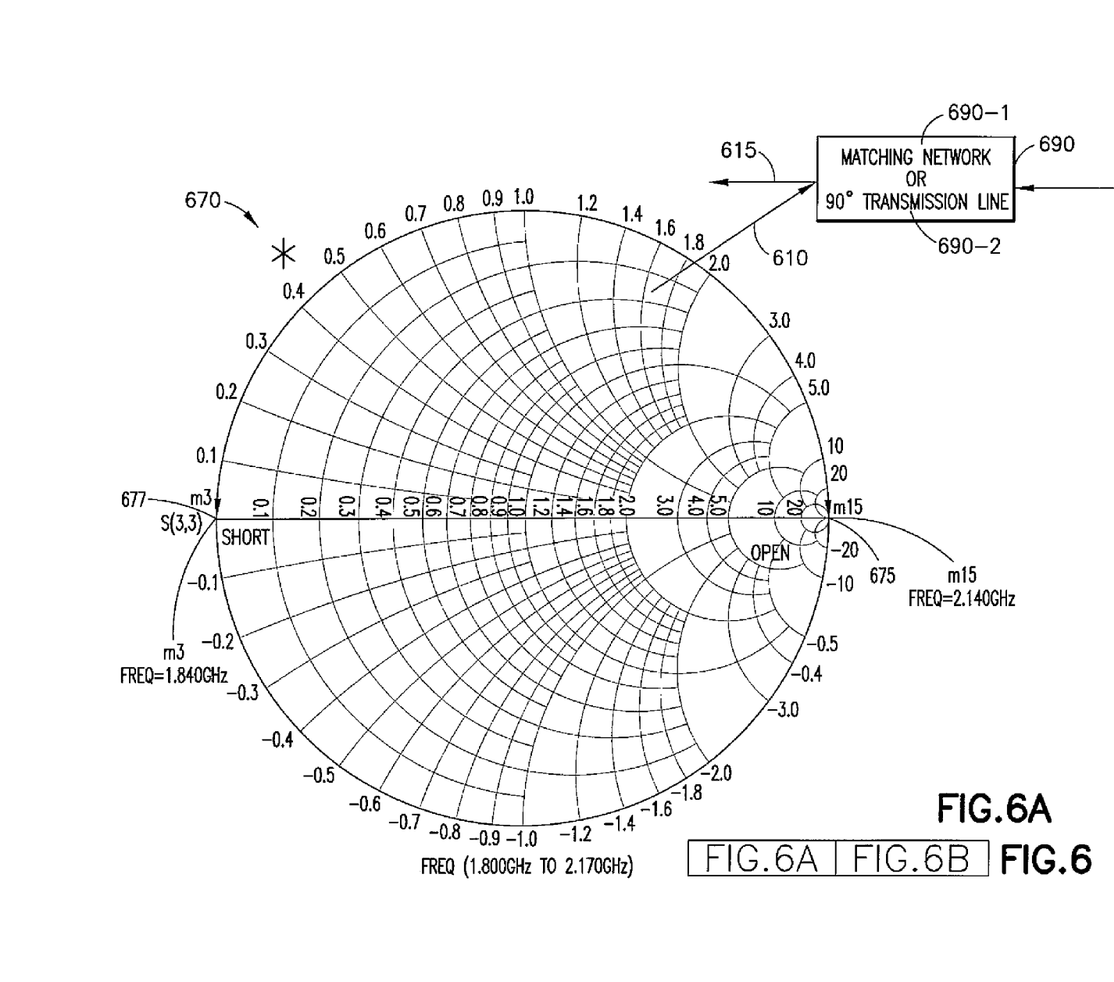
FIGS. 6A and 6B, illustrates an example of a resonant tank and matching circuitry for the resonant tanks 1 and/or 2 of FIG. 5.
Figure 6B:
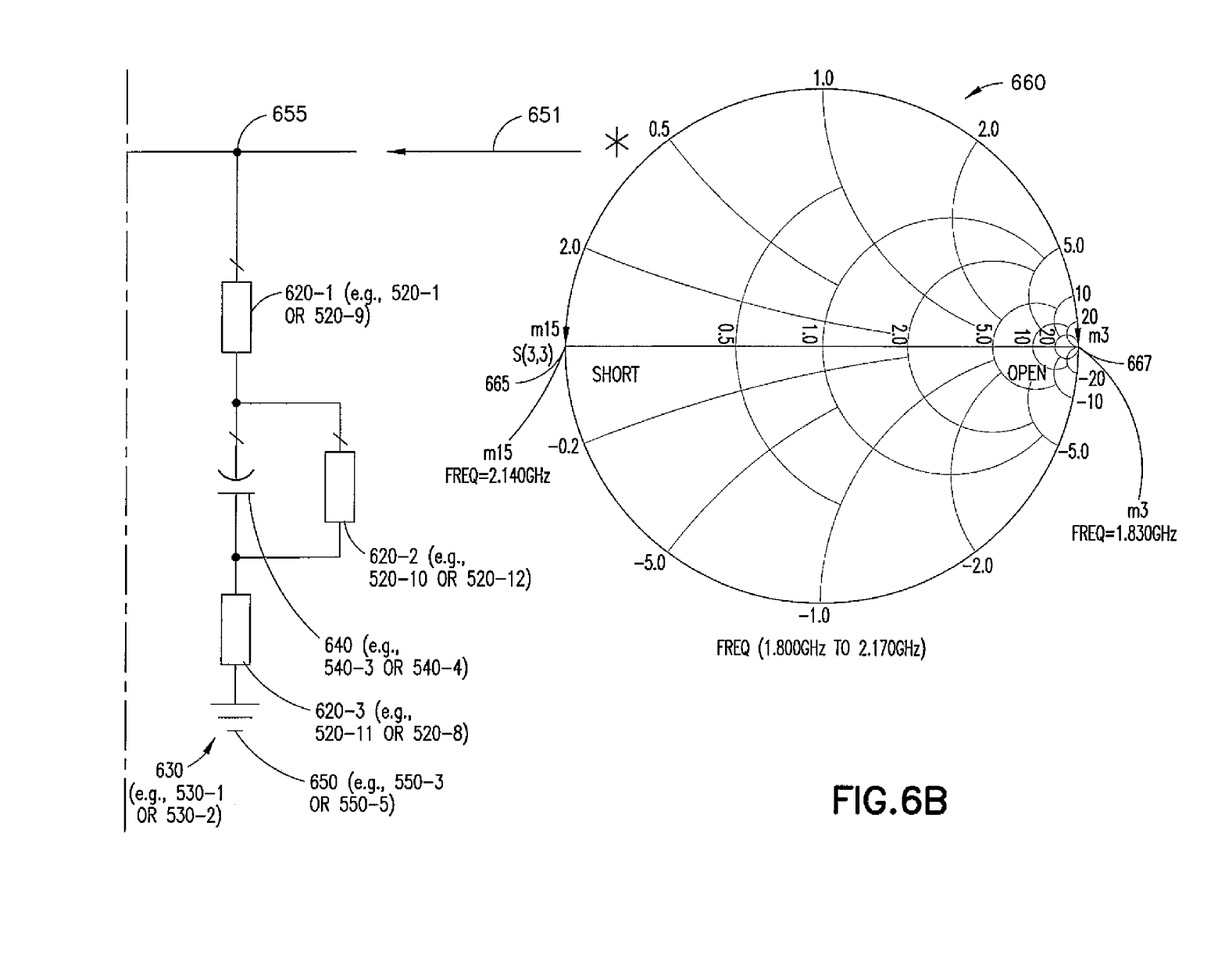

FIG. 6, which is split into FIGS. 6A and 6B, illustrates an example of a resonant tank 630 and matching circuitry 690 for the resonant tank 1 530-1 and/or resonant tank 2 530-2 of FIG. 5. The matching circuitry 690 is similar to the $\lambda/4$ transformer 340 in FIG. 3, the point 655 would be coupled to the output of the main amplifier 310, and the point 615 would be coupled to the output manifold 360. Depending on point of view, this could also be reversed, with the point 615 being coupled to the output of the main amplifier 310, and the point 655 being coupled to the $\lambda/4$ transformer 350. Note that as illustrated in FIG. 5, an output matching network can be more complicated than a $\lambda/4$ transmission line (or transformer), such as a combination of short step transmission lines and capacitors (as is shown in FIG. 5). In this example, for the resonant tank 630 there is a transmission line 620-1 (e.g., one of TL 520-1 for resonant tank 1 or TL 520-9 for resonant tank 2), a transmission line 620-2 (e.g., one of TL 520-10 for resonant tank 1 or TL 520-12 for resonant tank 2) and a capacitor 640 (e.g., one of C 540-3 for resonant tank 1 or C 540-4 for resonant tank 2) in a parallel configuration, and a transmission line 620-3 (e.g., one of TL 520-11 for resonant tank 1 or TL 520-8 for resonant tank 2) that is coupled to a ground connection 650 (e.g., one of ground connection 550-3 for resonant tank 1 or ground connection 550-5 for resonant tank 2). The resonant tank 630 is connected to a matching circuit 690 comprising one of a matching network 690-1 or a 90 degree (°) transmission line 690-2.

There are two Smith charts 660 and 670 illustrated in FIG. 6, which cover values of frequency range from 1.800 GHz to 2.170 GHz. The Smith chart 660 illustrates the impedance looking into (illustrated by reference 651) the point 655. It is seen that there is an open for the 1800 MHz frequency band, illustrated by m3 667. The open is at 1.830 GHz. There is also a short for the 2100 MHz frequency band, illustrated by m15 665. The short is at 2.140 GHz. The Smith chart 670 illustrates the impedance looking into (illustrated by reference 610) the point 615, which can be the input to the output matching network 320-1, or output of the λ/4 transformer 350-1 to the output manifold 360. A 90 degrees transmission line can also be replaced with matching network. It is seen that there is an open for the 2100 frequency band, illustrated by m15 675. The open is at 2.140 GHz in this example. There is also a short for the 1800 MHz frequency band, illustrated by m3 677. The short is at 1.840 GHz. Thus, signals in the 1800 MHz frequency band will pass through (from the point 655 to the point 615) the circuitry of FIG. 6, but signals in the 2100 MHz frequency band will not. Additionally, signals in the 2100 MHz frequency band will not pass into (from point 615) and instead will be reflected from the matching circuitry 690.

Figure 7A:
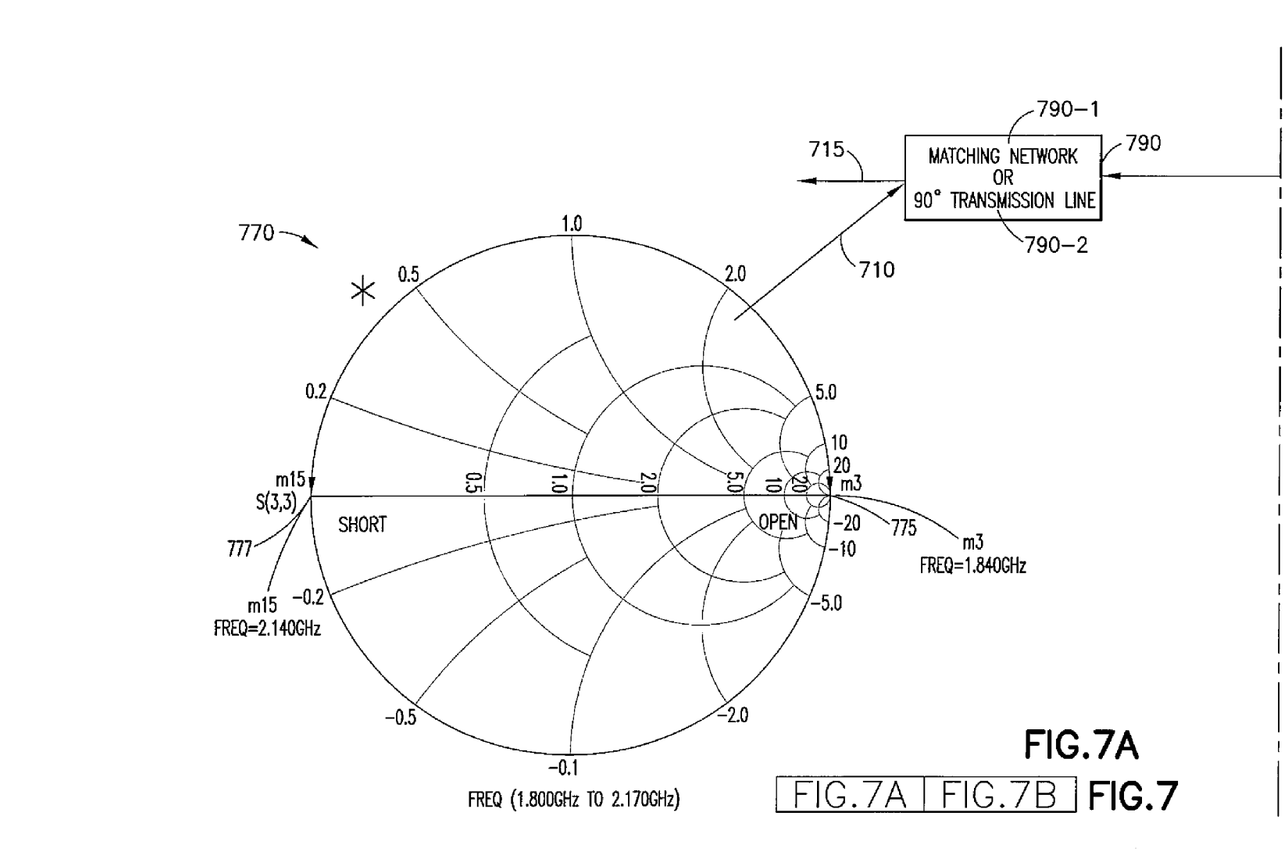
FIGS. 7A and 7B, illustrates an example of a resonant tank and matching circuitry for the resonant tanks 3 and/or 4 of FIG. 5.
Figure 7B:
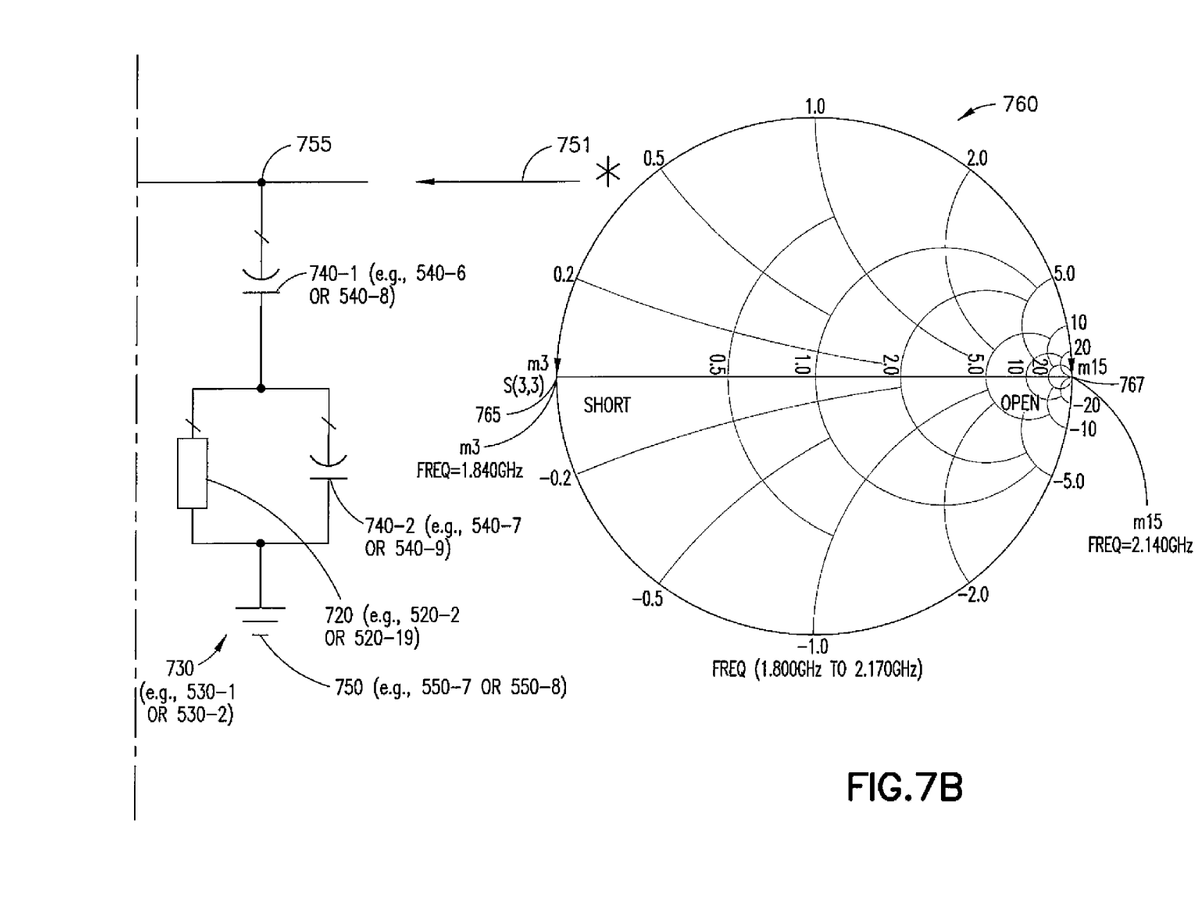

FIG. 7, which is split into FIGS. 7A and 7B, illustrates an example of a resonant tank 730 and matching circuitry 790 for the resonant tank 3 530-3 and/or resonant tank 4 530-4 of FIG. 5. The matching circuitry 790 is similar to the output matching network 320-2 in FIG. 3, the point 715 could be coupled to the output of the main amplifier 310, and the point 755 could be coupled to the λ/4 (quarter-wavelength) transformer 350-2 (e.g., or another resonant tank as illustrated in FIG. 5). As another example, the point 755 could be coupled to the output of the main amplifier 310, and the point 755 could be coupled to the output manifold 360. In this example, for the resonant tank 730 there is a capacitor 740-1 (e.g., one of C 540-6 for resonant tank 3 or C 540-8 for resonant tank 4), a transmission line 720 (e.g., one of TL 520-2 for resonant tank 3 or TL 520-19 for resonant tank 4) and a capacitor 740-2 (e.g., one of C 540-7 for resonant tank 3 or C 540-9 for resonant tank 4) in a parallel configuration, whose output is coupled to a ground connection 750 (e.g., one of ground connection 550-7 for resonant tank 3 or ground connection 550-8 for resonant tank 4). The resonant tank 730 is connected to a matching circuit 790 comprising one of a matching network 790-1 or a 90 degree)(° transmission line 790-2.

There are two Smith charts 760 and 770 illustrated in FIG. 7, which cover values of frequency range from 1.800 GHz to 2.170 GHz. The Smith chart 760 illustrates the impedance looking into (illustrated by reference 751) the point 755. It is seen that there is an open for the 2100 frequency band, illustrated by m15 767. The open is at 2.140 GHz. There is also a short for the 2100 frequency band, illustrated by m3 765. The short is at 1.840 GHz. The Smith chart 770 illustrates the impedance looking into (illustrated by reference 710) the point 715, which is the output of the matching circuitry 790, which can be the input to the output matching network 320-2, or output of the λ/4 transformer 350-2 to the output manifold 360. It is seen that there is an open for the 1800 MHz frequency band, illustrated by m3 775. The open is at 1.840 GHz. There is also a short for the 2100 MHz frequency band, illustrated by m3 777. The short is at 2.140 GHz. Thus, signals in the 2100 frequency band will pass through (from the point 755 to the point 715) the circuitry of FIG. 7, but signals in the 1800 MHz frequency band will not. Additionally, signals in the 1800 MHz frequency band will not pass into (from point 715) and instead will be reflected from the matching circuitry 790.

In some cases, only one resonant tank is needed in each path as shown in FIG. 3. However, if it is desired to have multiple resonant tanks per path, Since the exemplary embodiments provide isolation both at the input and output between two bands, the Doherty amplifier can be designed independently for each frequency band in each path to deliver the best performance without interference from the opposite band.

Without in any way limiting the scope, interpretation, or application of the claims appearing below, a technical effect of one or more of the example embodiments disclosed herein is to use a single main amplifier for multiple frequency bands in a Doherty amplifier. Another technical effect of one or more of the example embodiments disclosed herein is creation and use of high efficiency Doherty power amplifier in a dual-band (or multiple-band) application.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:

λ wavelength
λ/4 quarter-wavelength
amp amplifier
amps amplifiers
C capacitor
DC direct current
E electrical length
eNB (or eNodeB) evolved Node B (e.g., an LTE base station)
f or freq frequency or frequencies
GHz giga-Hertz
Hi Q high quality factor, where quality Q may be defined as Q=center frequency/bandwidth
I/F interface
LTE long term evolution
MHz mega-Hertz
MME mobility management entity
multi-band multiple-band
NCE network control element
N/W network
PA power amplifier
PAR peak to average power ratio pF pico-Farad
RRH remote radio head
RF radio frequency
Rx receiver
SGW serving gateway
TL transmission line
TRX transmitter and receiver
Tx or TX transmitter
UE user equipment (e.g., a wireless, typically mobile device)
Z impedance

What is claimed is:

1. An apparatus, comprising:
a Doherty power amplifier having an input and having an output manifold configured to be coupled to a load and comprising:
a peaking amplifier path between and coupled to the input of the Doherty power amplifier and the output manifold and terminating in the output manifold, the peaking amplifier path comprising at least one peaking amplifier configured to amplify signals over multiple frequency bands;
a main amplifier path between and coupled to the input of the Doherty power amplifier and the output manifold and terminating in the output manifold, the main amplifier path separate from the peaking amplifier path until the main amplifier path terminates in the output manifold, the main amplifier path comprising:
at least one main amplifier coupled to the input of the Doherty power amplifier and having an output, the at least one main amplifier configured to amplify signals over the multiple frequency bands; and
a multiple-band matching network coupled to the output of the at least one main amplifier and terminating in the output manifold, the multiple-band matching network comprising a plurality of signal paths, one path for each of the multiple frequency bands, where each signal path for the multiple frequency bands terminates in the output manifold and comprises circuitry coupled to the output of the at least one main amplifier, the circuitry for each signal path configured to pass signals to the output manifold from only a unique one of the multiple frequency bands and to reject signals from others of the multiple frequency bands, the circuitry for each signal path comprising a resonant tank.

2. The apparatus of claim 1, further comprising one or more additional peaking amplifier paths between and coupled to the input of the Doherty power amplifier and the output manifold and terminating in the output manifold, each of the one or more additional peaking amplifier paths comprising at least one peaking amplifier configured to amplify signals over the multiple frequency bands.

3. The apparatus of claim 1, wherein each peaking amplifier path comprises an output wide band matching network for the multiple bands that passes at least the multiple bands but rejects signals in other bands and that delivers an optimum peaking amplifier performance for an entire operating bandwidth, the output wide band matching network for the multiple bands having an input coupled to an output of the at least one peaking amplifier and having an output coupled to and terminating in the output manifold.

4. The apparatus of claim 1, wherein multiple peaking amplifiers in series may be used as one or more of the at least one peaking amplifiers in the peaking amplifier path, the one or more additional peaking amplifier paths, or both the peaking amplifier path and the one or more additional peaking amplifier paths.

5. The apparatus of claim 1, wherein the at least one main amplifier comprises multiple main amplifiers in series.

6. The apparatus of claim 1, wherein the circuitry for at least one of the signal paths comprises an output matching network for a corresponding frequency band and connected to the output of the at least one main amplifier, the output matching network connected to the output of the at least one main amplifier configured to pass signals for the corresponding frequency band and reject signals from others of the frequency bands.

7. The apparatus of claim 6, wherein the output matching network connected to the output of the at least one main amplifier comprises a ninety degree transmission line or any equivalent network that can achieve a desired impedance transformation for at least one of the signal paths.

8. The apparatus of claim 1, wherein the circuitry for at least one of the signal paths comprises an output matching network for a corresponding frequency band and connected to the output manifold, the output matching network connected to the output manifold configured to pass signals for the corresponding frequency band and reject signals from others of the frequency bands.

9. The apparatus of claim 1, wherein the output matching network connected to the output manifold comprises a ninety degree transmission line or any equivalent network that can achieve a desired impedance transformation for at least one of the signal paths.

10. The apparatus of claim 1, wherein one or more signal paths comprise multiple resonant tanks.

11. The apparatus of claim 1, wherein the multiple-band matching network has only two signal paths, a first signal path for a first frequency band, and a second signal path for a second frequency band.

12. The method of claim 1, wherein a selected resonant tank for a selected frequency band and corresponding selected signal path comprises a first transmission line coupled to the input of the resonant tank, a second transmission line and capacitor in a parallel configuration coupled to an output of the first transmission line, and a third transmission line having an input coupled to an output of the parallel configuration of the second transmission line and capacitor, wherein an output of the third transmission line is coupled to a ground connection.

13. The apparatus of claim 12, wherein for the selected signal path, there are two selected resonant tanks in parallel as part of the circuitry for the selected signal path.

14. The apparatus of claim 1, wherein a certain resonant tank for a certain frequency band and corresponding certain signal path comprises a first capacitor coupled to the input of the resonant tank, a transmission line and second capacitor in a parallel configuration coupled to an output of the first capacitor, wherein an output of the parallel configuration of the transmission line and second capacitor is coupled to a ground connection.

15. The apparatus of claim 14, wherein for the certain signal path, there are two certain resonant tanks in parallel as part of the circuitry for the certain signal path.

16. The apparatus of claim 1, wherein the first frequency band is an 1,800 MHz frequency band and the second frequency band is a 2,100 MHz frequency band.

17. The apparatus of claim 1, wherein the Doherty power amplifier further comprises a wide band splitter coupled to the input of the Doherty power amplifier and configured to split an input signal into the peaking amplifier path and into the main amplifier path.

18. The apparatus of claim 1, wherein the apparatus comprises a transmitter comprising the Doherty power amplifier.

19. The apparatus of claim 18, wherein the apparatus comprises a base station comprising the transmitter.

* * * * *